(12) United States Patent
Holderer et al.

(10) Patent No.: US 7,800,849 B2
(45) Date of Patent: Sep. 21, 2010

(54) APPARATUS FOR MOUNTING TWO OR MORE ELEMENTS AND METHOD FOR PROCESSING THE SURFACE OF AN OPTICAL ELEMENT

(75) Inventors: Hubert Holderer, Oberkochen (DE); Thomas Petasch, Aalen (DE); Chris Reed, Darien, CT (US); Dragos Pariza, Bronx, NY (US); Mike Meehan, Southbury, CT (US); Gary Krebs, New Fairfield, CT (US)

(73) Assignee: Carl Zeiss SMT AG, Oberkochen (DE)

( * ) Notice: Subject to any disclaimer, the term of this patent is extended or adjusted under 35 U.S.C. 154(b) by 365 days.

(21) Appl. No.: 11/722,091

(22) Filed: Feb. 1, 2008

(65) Prior Publication Data
US 2009/0015947 A1    Jan. 15, 2009

Related U.S. Application Data

(60) Provisional application No. 60/639,842, filed on Dec. 28, 2004.

(51) Int. Cl.
G02B 7/02 (2006.01)

(52) U.S. Cl. ...................................... 359/822

(58) Field of Classification Search ................ 359/726, 359/811, 819, 820, 822
See application file for complete search history.

(56) References Cited

U.S. PATENT DOCUMENTS

| | | | |
|---|---|---|---|
| 3,758,217 A | 9/1973 | Stokstad | |
| 4,012,124 A | 3/1977 | Toda et al. | |
| 5,638,223 A | 6/1997 | Ikeda | |
| 6,004,007 A | 12/1999 | Weigert | |
| 6,043,863 A | 3/2000 | Ikeda | |
| 6,256,147 B1 | 7/2001 | Davis | |
| 6,276,398 B1 | 8/2001 | Lange | |
| 6,362,926 B1 | 3/2002 | Omura et al. | |
| 6,661,589 B2 * | 12/2003 | Takanashi et al. | ........... 359/819 |
| 7,079,331 B2 | 7/2006 | Weber et al. | |
| 2001/0028462 A1 | 10/2001 | Ichihara et al. | |
| 2002/0171922 A1 | 11/2002 | Shiraishi et al. | |
| 2005/0110447 A1 | 5/2005 | Weber et al. | |
| 2005/0286121 A1 | 12/2005 | Weber et al. | |
| 2006/0012893 A1 | 1/2006 | Weber et al. | |

FOREIGN PATENT DOCUMENTS

| | | |
|---|---|---|
| DE | 102 25 547 A1 | 10/2003 |
| DE | 102 25 265 A1 | 12/2003 |

(Continued)

OTHER PUBLICATIONS

XP009006617 "Modular Optical Alignment"; Daniel Vukobratovich, Raytheon Systems Co.; Denver, Colorado, Jul. 1999; SPIE vol. 3786.

*Primary Examiner*—Jessica T Stultz
*Assistant Examiner*—Mahidere S Sahle
(74) *Attorney, Agent, or Firm*—GrayRobinson, P.A.

(57) ABSTRACT

In an apparatus for mounting two or more optical elements that are each held in an individual mount or in a support structure, said optical elements are mounted in a common mount. The relative positioning of the optical elements (10, 11) in the common mount (18) can be set.

4 Claims, 2 Drawing Sheets

FOREIGN PATENT DOCUMENTS

| | | |
|---|---|---|
| DE | 102 26 655 A1 | 1/2004 |
| DE | 102 46 898 A1 | 4/2004 |
| DE | 102 48 849 A1 | 4/2004 |
| EP | 1 231 517 A1 | 8/2002 |
| WO | 02 084671 A1 | 10/2002 |
| WO | 2004 034149 A1 | 4/2004 |
| WO | 2004/057378 A1 | 7/2004 |

* cited by examiner

APPARATUS FOR MOUNTING TWO OR MORE ELEMENTS AND METHOD FOR PROCESSING THE SURFACE OF AN OPTICAL ELEMENT

CROSS REFERENCE TO RELATED APPLICATION

This is a U.S. National Phase Entry under 35 U.S.C. §371 of International Application PCT/EP2005/014088 filed Dec. 22, 2005 which, in turn, claims priority under 35 U.S.C. §119(e) to U.S. Provisional Patent Application Ser. No. 60/639,842 filed Dec. 28, 2004.

FIELD OF THE INVENTION

The invention relates to an apparatus for mounting optical elements that are each held in an individual mount or in a support structure, at least two optical elements with their individual mounts or with their support structures being mounted in a common mount. The invention also relates to a microlithography projection objective for producing semiconductor elements.

BACKGROUND OF THE INVENTION

U.S. Pat. No. 5,638,223 discloses a projection objective that is assembled from a number of modules or individual subassemblies that are connected to one another and in this way are assembled to form a common objective housing. Each subassembly can in this case have a number of optical elements. The connection of the individual subassemblies to form a unit is performed by a multiplicity of flanges connected to one another via screwed connections.

However, it is disadvantageous of such a projection objective that the adjustment of the individual components to one another and to the objective housing, and their alignment with the optical axis (z-axis) is very complicated. On the occasion of exchanging or repairing individual subassemblies or optical elements, there is a renewed need for the entire objective to be aligned and/or adjusted with a correspondingly high outlay.

A modular design of an objective or lens system is described from "Vukobratovich, Modular Optical Alignment, Proceedings of the Spie, Spie, Bellingham, Va., US, Vol. 3786, Jul. 20, 1999 (Jul. 20, 1999), pages 427-438, XP009006617, ISSN: 0277-786X, page 427-page 428".

Reference is made to the older German application DE 102 46 898 for the further prior art.

Also known are projection objectives (for example DE 102 25 265.3) as so-called catadioptric objectives with a beam splitter element that reflects the incident linearly polarized light from a vertical into a horizontal part of the objective. After reflection of the light at a reflecting element and a change in the polarization direction by 90°, the light passes through the beam splitter element and is subsequently deflected at a reflecting mirror in such a way that the beam subsequently impinging on a wafer corresponds in direction to the direction of the entrance beam into the objective.

The optical elements used in the objective are generally held in individual mounts and then connected to the objective housing via the latter.

A problem with projection objectives, in particular when the latter are operated in very short wavelength regions such as, for example, 193 or 157 nm, consists in that a very high accuracy is required both in positioning them in the objective housing and when positioning the optical elements with respect to one another, in order to achieve the desired high imaging accuracy. A high imaging accuracy requires, in part, that the optical elements such as, for example, the beam splitter element, be removed from the objective for remachining, and then be remachined, for example have their surface corrected. It is to be ensured here that after reinstallation the same installation conditions obtain again with narrow tolerances.

At the same time, the positionings of optical elements relative to one another, in particular of optical elements that interact directly, are also to be maintained. This holds, in particular, for the beam splitter element and the deflecting mirror arranged downstream thereof in the beam direction. There is, moreover, the requirement that the optical elements be mounted in mounts that have a high natural frequency, but at the same time are intended to decouple the optical element from deformations.

Reference is made to U.S. Pat. No. 6,362,926 and U.S. Pat. No. 6,043,863 for the further prior art.

Concerning high-quality optical imaging devices such as in the case of the projection objective described at the beginning, for example, the optical elements must have very high accuracies with reference to their imaging quality. This holds, in particular, for lenses and mirrors with reference to their surface, for example to their fits. The same holds for coatings for blooming the surface.

Reference is made to U.S. Pat. No. 6,276,398 B1, the older DE 102 59 536.4, US 2002/0171922 A1, WO 02/084671 A1 and U.S. Pat. No. 6,256,147 B1 for the relevant prior art.

SUMMARY OF THE INVENTION

It is therefore the object of the present invention to provide an apparatus of the type mentioned at the beginning and a projection objective with the aid of which the above-named problems are solved, in particular a positioning of two or more optical elements relative to one another being maintained even when individual optical elements are installed or removed, and this installation or removal resulting in reproducible conditions even with reference to the entire orientation in the objective.

This object is achieved according to the invention by virtue of the fact that the relative positioning of the optical elements in the common mount can be set.

A microlithography projection objective for producing semiconductor elements is claimed in claim 13, in which a number of optical elements that are held in individual mounts or support structures are arranged in an objective housing, and at least two optical elements are mounted with their individual mounts or with their support structures in a common mount. It is provided here according to the invention that the relative positioning of the optical elements in the common mount or support structure can be set.

According to the invention, two or more optical elements are now held in a common mount in such a way that there is an individually decoupled connection of each optical element to the common mount, for example by means of an appropriate mounting in an individual mount or a support structure. It is likewise possible that the individual mount or the support structure can in turn be set and adjusted in relation to the common mount and thus also to the other optical element or elements that are held in the common mount.

This refinement renders it possible, for example, to process an optical element outside the objective. Likewise, measurements such as, for example, adjustment measurements and alignments, are possible independently of an installed state in the installed position for the common mount. If necessary, it is also possible to provide manipulation devices for positioning and/or manipulating the optical elements in their individual mount or support structure, and also relative to one another in the common mount.

One of the principal advantages of the solution according to the invention consists in that the above-named measures can be undertaken separately, that is to say independently of the objective in which the common mount is to be or has been installed.

Thus, the individual optical elements can be processed in their mounts outside the objective, and also subsequently be readjusted exactly to one another in the common mount outside the objective. Subsequently, the individual optical elements with their common mount can be reinserted as a unit into the objective and adjusted. The same holds, for example, for repair purposes after an instance of removal.

It is a further object of the present invention to provide a production method that is capable of enabling the required accuracies for optical elements, in particular lenses and mirrors, in the case of imaging devices of very high quality such as, for example, projection objectives.

This object is achieved according to the invention in a method for processing the surface of an optical element that is inserted in an imaging device, in particular a projection objective, having the following steps:

1.1 the optical element is preprocessed as individual component by production methods on its surface;
1.2 the optical element is mounted on an individual mount or support structure;
1.3 together with its individual mount or support structure, the optical element is installed in the imaging device in the installed position characteristic of the later normal operation;
1.4 the surface of the optical element is measured via an optical method, the data of the surface being acquired and stored;
1.5 a correct data record is determined from the acquired data;
1.6 the optical element with its individual mount or support structure is dismounted again and subjected to further processing, the processing being performed as a function of the correction data record; and
1.7 the optical element is again installed with its individual mount or support structure in the imaging device.

Thus, according to the invention, the optical element, for example a mirror, together with the mount or the support structure in which the optical element is held is measured virtually on the spot in the later installed position in the imaging device, for example the projection objective. Subsequently, in the re-removed state the surface, for example the fits, is processed separately with the aid of the data sets on the basis of the measurement results. Subsequently, the optical element is reinstalled in the imaging device, this preferably being performed in the common mount, in which a number of optical elements are held.

A substantial advantage resulting from the method according to the invention is that the surface is processed with the aid of measurements that were undertaken in the installed position, that is to say in the later operation of the optical element, and that reproducibility is also simultaneously present.

Depending on the results achieved and/or renewed monitoring after the optical element has been reinstalled, the above-named method steps are, if necessary, repeated once again in order thus to achieve the desired corrections and/or changes such that a desired high imaging quality is provided.

It is also advantageous that the layer thickness later applied to the surface by coating can be reserved during processing. The optical element is not dismounted again and fed for final processing until after satisfactory results of the surface, for example the fits, in the installed and aligned state of the optical element. In the case of a mirror, this is the application of the reflective surface, while in the case of a lens it is, for example, the application of an antireflection layer. In both cases, the optical element is held in its mount or support structure, thus providing an appropriate reproducibility of the results obtained and of the installed position subsequently reinstated.

BRIEF DESCRIPTION OF THE DRAWINGS

Advantageous developments and refinements follow from the remaining subclaims, and the invention is described below in principle with the aid of the drawing, in which:

DETAILED DESCRIPTION OF THE PREFERRED EMBODIMENT

Figure 1:
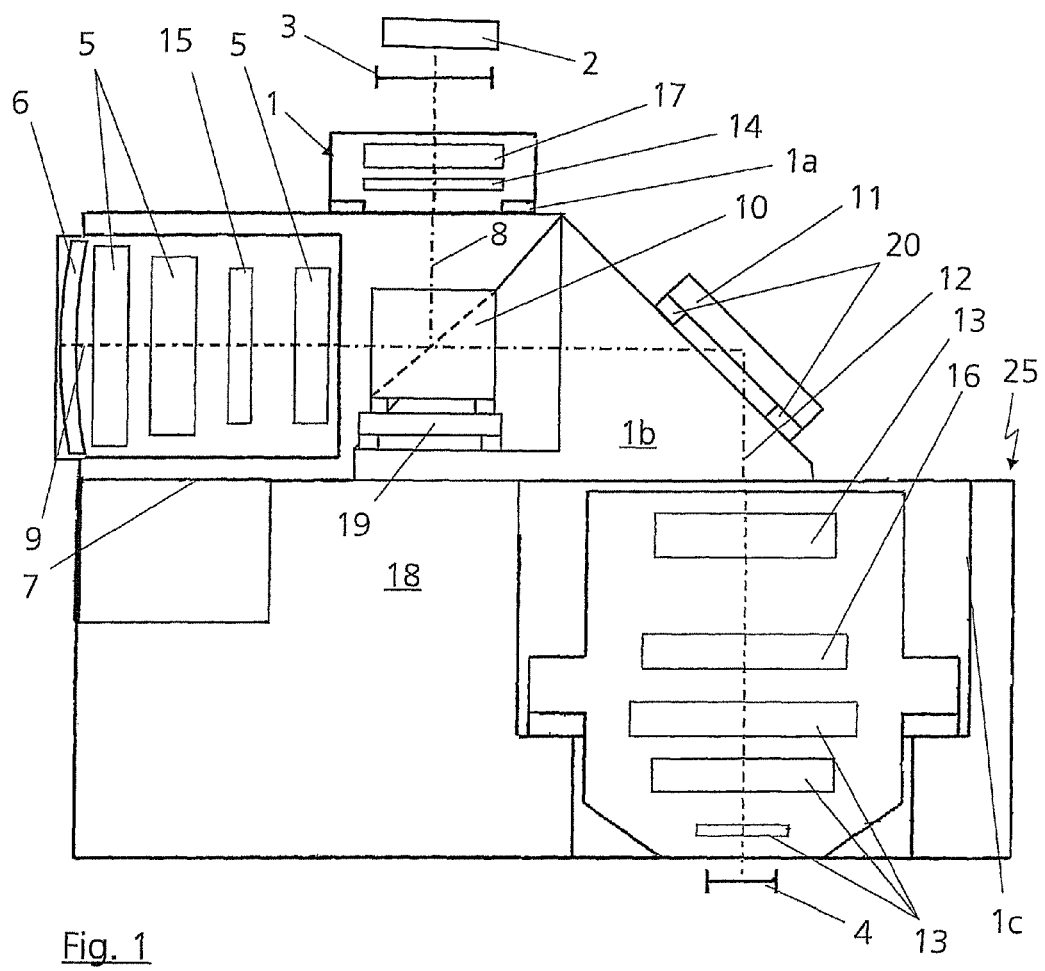
FIG. 1 shows a schematic illustration of a microlithography projection objective.

FIG. 1 illustrates schematically a projection exposure machine with a projection objective 1 as microlithography imaging device for producing semiconductor elements.

There is an illumination system 2 with a laser (not illustrated) as light source. Located in the object plane of the projection exposure machine is a reticle 3 whose pattern is to be imaged, on an appropriately reduced scale, onto a wafer 4 that is arranged below the projection objective 1 and is located in the image plane.

The projection objective 1 is provided with a first vertical housing part 1a and a second horizontal housing part 1b. Located in the housing part 1b are a number of lenses 5 and a concave mirror 6 that are arranged in an objective housing part 7 of the housing part 1b. A beam splitter cube is provided as beam splitter element 10 for the purpose of deflecting the projection beam (see arrow) from a vertical optical axis 8 into a horizontal optical axis 9 in the horizontal housing part 1b.

The housing part 1a constitutes a common mount for the optical elements arranged therein. The same holds for the objective housing 7 with the several lenses 5 arranged therein, and the concave mirror 6. If necessary, however, the concave mirror 6 can also be provided as a separate unit.

After reflection of the beams at the concave mirror 6 and subsequent passage through the beam splitter cube 10, these strike a deflecting mirror 11. At the deflecting mirror 11, the horizontal beam path along the optical axis 9 is deflected once more into a vertical optical axis 12.

The beam splitter cube 10 and the deflecting mirror 11 are mounted on a common basic structure 18.

A third vertical objective part 1c with a further lens group 13 is located below the deflecting mirror 11. In addition, three λ/4 plates 14, 15 and 16 are also located in the beam path. In the projection objective 1, the λ/4 plate 14 is located between the reticle 3 and the beam splitter cube 10 downstream of a lens or lens group 17 arranged in the housing part 1a. The λ/4 plate 15 is located in the beam path of the horizontal objective part 1b, and the λ/4 plate 16 is located in the third objective part 1c. The three λ/4 plates serve the purpose of completely rotating the polarization once, as a result of which, inter alia, beam losses are minimized.

Figure 2:
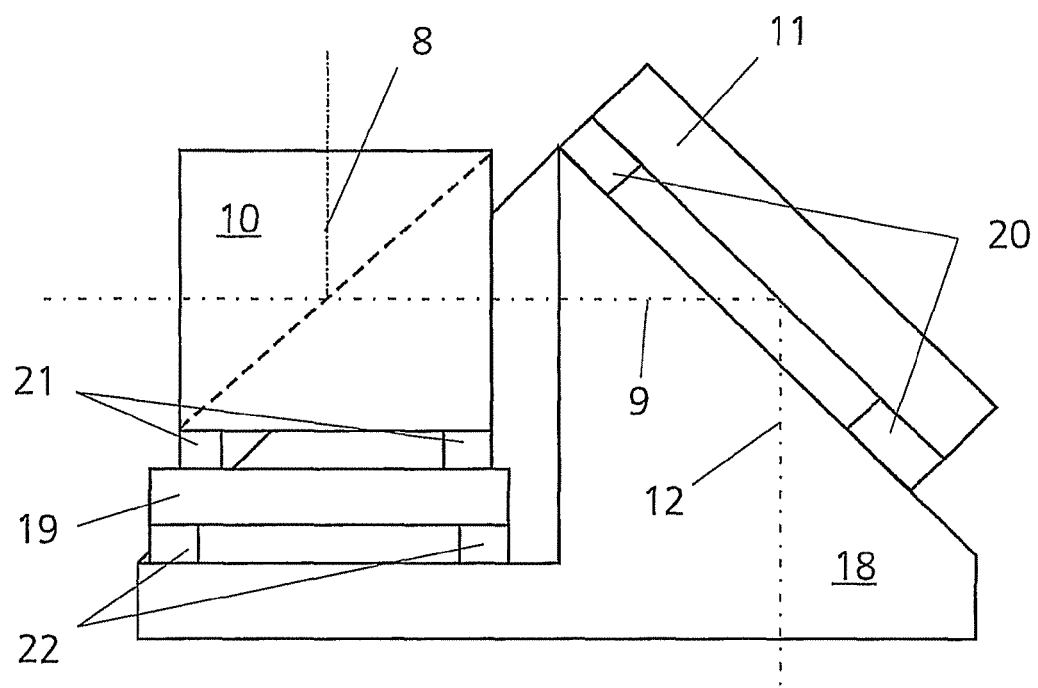
FIG. 2 shows an enlarged side view of a basic structure as common mount with two optical elements.

An apparatus according to the invention is described in FIG. 2 as a common mount 18 of a basic structure. As already mentioned, the basic structure is provided as a common mount 18 for the beam splitter element 10 and the deflecting mirror 11 downstream in the beam direction.

Of course, the common mount 18 or basic structure for the beam splitter element 10 and the deflecting mirror 11 are regarded only as exemplary. If necessary, it is possible both to arrange more optical elements in a common mount or basic structure, and also other optical elements of an objective. This applies, in particular, to the housing part 1b, the objective housing part 7 and the objective part 1c. It is also possible in the case of the objective part 1c to undertake yet further subdivisions into subgroups with in each case a number of optical elements arranged in a common mount.

As may be seen, the beam splitter element 10 designed as beam splitter cube is mounted on a support frame 19 as support structure, while the deflecting mirror 11 is mounted via tuning elements 20 that constitute a support structure. The beam splitter element 10 is connected to the support frame 19 via decoupling elements 21 (not illustrated in more detail). The tuning elements 20 of the deflecting mirror 11 are provided with a number of manipulation elements, or are designed as manipulation elements by means of which the deflecting mirror 11 can be adjusted in the x- and y-directions and in the direction of the optical axis, or its inclination to the optical axis 9 or 12 can be adjusted. At the same time, the deflecting mirror 11 is thereby also adjusted in relation to the beam splitter element 10. Likewise arranged between the support frame 19 and the common mount 18 as basic structure are tuning elements 22 by means of which the position of the beam splitter element 10 can be set in relation to the common basic structure, and thus also in relation to the deflecting mirror 11.

Manipulation elements for the beam splitter element 10 and the deflecting mirror 11 are generally known, for which reason no further detail will be given thereon. The same holds for the decoupling elements 21. The manipulation elements and tuning elements 20 and 22 can, for example, comprise electromechanical elements such as, for example, piezoelectric elements or piezo-stacks. Reference is made for this purpose to, for example, DE 102 48 849.5, DE 102 26 655.7 (U.S. Ser. No. 10/458,968), DE 102 25 265.3 and DE 102 12 547 A1.

The inventive mounting of the beam splitter element 10 and the deflecting mirror 11 on a basic structure as common mount 18 is particularly advantageous for these two units. The two units must be aligned exactly with one another and also with the objective housing, in order to fulfill the very high demands on the accuracy of the projection beam, and thus on the imaging quality. The precise settings required for this purpose can now be undertaken in the removed state, that is to say independently of the objective. After conclusion of the required work on measurement and adjustment, the basic structure 18 can then be connected again to the objective housing 25 of the projection objective 1 in a way not illustrated in more detail. This means that the mutual setting and adjustment of beam splitter element 10 and deflecting mirror 11 is therefore maintained, and all that is further necessary is to adjust the entire basic structure 18 in the objective housing 25.

Of course, it is also possible still to undertake changes in adjustment and readjustments subsequently given an appropriate configuration and position of the manipulation elements.

The aforementioned advantages of the setting and adjustment of optical elements that are arranged in a common mount, outside and independently of the objective 1 itself, also apply to the other common mounts 1a, 7 and 1c. It is possible here to undertake a separate adjustment and setting in the installed position in each case. This is advantageous, in particular, when weights of the optical elements must be taken into account. The same holds either when individual optical elements need to be provided with final processing such as, for example, a surface coating, or when remachining is undertaken and this requires the corresponding common mount 18 to be removed. After such processing, the processed optical element can be reinstalled in the common mount 18 and adjusted, and only thereafter is the common mount reinstalled in the objective housing 25. An exemplary embodiment of such a processing method is described below, in addition.

The common mount 18 can be detachably connected to the objective housing 25, or else itself form a part of the objective 1 or objective housing 25.

A further advantage of this design also consists in that these operations can be undertaken in parallel, thus correspondingly speed up the overall assembly of the objective 1.

When, taking account of a high natural frequency, the individual optical elements with decoupling elements are connected to their individual mounts, support structures and/or to their common mount, the setting operations required for this purpose can likewise be carried out in a simple way independently of or outside the objective housing 25.

Materials that have low coefficients of thermal expansion are preferably taken for the individual components, in particular for the mounts, in which case mutually adjacent parts should correspondingly have largely identical coefficients of thermal expansion.

The inventive apparatus is advantageously suitable both for wavelengths in the visible region and in the invisible region, such as 632.8 nm, 365 nm, 248 nm, 193 nm, 157 nm and further shorter wavelengths such as 13.5 nm, for example.

A method for processing the surface of a mirror, for example the deflecting mirror 11, as optical element is described below in principle, in order to achieve the high accuracies required for the optical elements of a projection objective 1. Of course, the following processing also applies, mutatis mutandis, to a lens as optical element.

The deflecting mirror is mounted on the tuning elements 20, which constitute a support structure for the deflecting mirror 11, and mounted on the basic structure as common mount 18 together with the beam splitter element 10. The beam splitter element 10 and the deflecting mirror 11 were installed together in the objective via the common mount 18. The deflecting mirror 11 is measured interferometrically in a known way in this installed position. Deformations are determined in this way as overall surface defects. This holds for all deformations irrespective of their origin, for example whether they originate from prefabrication, mounting or from a gravitation effect. The data obtained in this way are converted into a correction data record and made available for a correction process. The deflecting mirror 11 arranged on the tuning elements 20 or, if appropriate, also the basic structure as common mount 18 together with the beam splitter element 10 are subsequently removed again from the objective and taken to a remachining station at which the correction process is performed with reference to machining the surface with the aid of the correction data record provided.

Subsequently, the unit is again installed in the projection objective 1, and a renewed interferometric measurement is carried out for monitoring purposes. If necessary, the correction process is repeated with a corresponding renewed removal, until the required high accuracy prevails.

Once the surface of the deflecting mirror 11 has been finally corrected in this way, cleaning and vapor coating processes, for example for producing the reflective surface are performed. Here, likewise, there is no demounting of the subassembly; that is to say, although these remachinings are carried out for the deflecting mirror 11 in its state mounted on the tuning elements outside the projection objective 1, this is done in the end state, the tuning elements 20 likewise already being mounted in the basic structure 18.

The corrective processing for the reflective surface can be performed, for example, by means of an IBF (ion beam figuring) method.

One-off setting effects can also be corrected in the case of the inventive method, when the subassembly is correspondingly loaded before correction for example. The abovementioned processing method can be applied to all types of lenses, mirrors, beam splitter elements or prisms. Reproducible vapor coating influences on the fits of the optical element can likewise be reserved.

The invention claimed is:

1. A microlithography projection objective for producing semiconductor elements, said projection objective, comprising: a number of optical elements arranged in an objective housing, said optical elements being held in individual mounts or support structures, said number of optical elements comprising at least two optical elements mounted with their individual mounts, or with their support structures, in a common mount; wherein the relative positioning of the optical elements in said common mount can be set and the common mount is adjustable in said objective housing; and wherein, one of said at least two optical elements comprises a beam splitter element and another said at least two optical elements comprises a deflecting mirror.

2. A microlithography projection objective for producing semiconductor elements, said projection objective, comprising: a number of optical elements arranged in an objective housing, said optical elements being held in individual mounts or support structures, said number of optical elements comprising at least two optical elements mounted with their individual mounts or with their support structures in a common mount, wherein the relative positioning of said optical elements in said common mount can be set and said common mount is adjustable in said objective housing; wherein the projection objective has at least two optical axes including a first optical axis and a second optical axis and at least one of said optical elements in said common mount effects a deflection from said first optical axis into said second optical axis.

3. A projection objective as claimed in claim 2, wherein said two optical axes are not parallel with one another.

4. A projection objective as claimed in claim 2 or claim 3, wherein at least one of said optical elements in said common mount comprises a plane deflection mirror.

* * * * *

UNITED STATES PATENT AND TRADEMARK OFFICE
CERTIFICATE OF CORRECTION

| | | |
|---|---|---|
| PATENT NO. | : 7,800,849 B2 | Page 1 of 1 |
| APPLICATION NO. | : 11/722091 | |
| DATED | : September 21, 2010 | |
| INVENTOR(S) | : Holderer et al. | |

It is certified that error appears in the above-identified patent and that said Letters Patent is hereby corrected as shown below:

On the title page, add the following items:

Item 86 --PCT No.: PCT/EP2005/014088--

Item 22 --PCT Filed: December 22, 2005--

Signed and Sealed this
Thirty-first Day of May, 2011

David J. Kappos
*Director of the United States Patent and Trademark Office*